(12) United States Patent
Aguilar (10) Patent No.: US 12,139,810 B2
(45) Date of Patent: Nov. 12, 2024

(54) LOCALIZED ELECTROCHEMICAL DEPOSITION

(71) Applicant: Antony Aguilar, Scottsdale, AZ (US)

(72) Inventor: Antony Aguilar, Scottsdale, AZ (US)

(73) Assignee: Arizona Board of Regents on Behalf of Arizona State University, Scottsdale, AZ (US)

(*) Notice: Subject to any disclaimer, the term of this patent is extended or adjusted under 35 U.S.C. 154(b) by 0 days.

(21) Appl. No.: 17/348,423

(22) Filed: Jun. 15, 2021

(65) Prior Publication Data

US 2021/0388521 A1  Dec. 16, 2021

Related U.S. Application Data

(60) Provisional application No. 63/039,244, filed on Jun. 15, 2020.

(51) Int. Cl.
*C25D 17/12* (2006.01)
*C25D 5/02* (2006.01)
*C25D 5/04* (2006.01)
*C25D 5/18* (2006.01)
*H01L 31/0224* (2006.01)

(52) U.S. Cl.
CPC .............. *C25D 5/02* (2013.01); *C25D 5/04* (2013.01); *C25D 5/18* (2013.01); *C25D 17/12* (2013.01); *H01L 31/022425* (2013.01)

(58) Field of Classification Search
None
See application file for complete search history.

(56) References Cited

U.S. PATENT DOCUMENTS

| | | | | |
|---|---|---|---|---|
| 2,978,799 | A * | 4/1961 | Benteler | B21C 1/22 138/146 |
| 10,724,146 | B1 * | 7/2020 | Pain | B33Y 30/00 |
| 11,521,864 | B2 * | 12/2022 | Pain | H01L 21/485 |
| 2001/0014409 | A1 * | 8/2001 | Cohen | H01L 21/2885 205/70 |
| 2004/0154828 | A1 * | 8/2004 | Moller | H05K 3/07 174/257 |
| 2009/0071837 | A1 * | 3/2009 | Fredenberg | H05K 3/07 205/640 |
| 2018/0073160 | A1 * | 3/2018 | Higuchi | C25D 3/38 |

OTHER PUBLICATIONS

Wu et al. "Electrodeposition of microstructures using a patterned anode", Electrochemistry Communications, 13, 2011, 1229-1232 ( Year: 2011).*

(Continued)

*Primary Examiner* — Stefanie S Wittenberg
(74) *Attorney, Agent, or Firm* — Withrow & Terranova, P.L.L.C.

(57) ABSTRACT

Localized electrochemical deposition (LECD) is provided. The aim of LECD is to create a patterned electrodeposited metal layer on a cathode without the use of pre-deposition patterning steps. In embodiments described herein, an LECD device includes a cathode (a material to be plated) placed sufficiently close to a formation anode in a metal electrolyte chemical bath. The LECD device is then activated electrically in solution. An electric field created by the formation anode determines the locations of metal deposition, providing a localized deposition without need for photolithography or other masking of the material to be plated.

12 Claims, 10 Drawing Sheets

(56) References Cited

OTHER PUBLICATIONS

English translation WO2019190115, Huh et al. Oct. 3, 2019 (Year: 2019).*
English translation JP 3455705, Oct. 14, 2003 (Year: 2003).*
English translation JP 2005171288, Kubota et al. Jun. 30, 2005 (Year: 2005).*
Serra, et. al. "Sono-electrodeposition transfer of micro-scale copper patterns on to A7 substrates using a mask-less method", Electrochimica Acta, 207, 2016, 207-217. (Year: 2016).*
English translation JP 2017053008, Higuchi (Year: 2017).*
English translation JP8225997 (Year: 1996).*
Habib et al. "Fabrication of complex shape electrodes by localized electrochemical deposition" Journal of Materials Processing Technology, vol. 209, 2009, pp. 4453-4458.
Jansson et al. "High Resolution 3D Microstructures Made by Localized Electrodeposition of Nickel" Journal of The Electrochemical Society, vol. 147, No. 5, 2000, pp. 1810-1817.
Madden et al. "Fabrication by Electrodeposition: Building 3D Structures and Polymer Actuators" Sixth International Symposium on Micro Machine and Human Science, IEEE, 1995, pp. 77-81.
Roy "EnFACE: a maskless process for circuit fabrication" Circuit World, vol. 35, No. 3, 2009, pp. 8-11.
Xu et al. "A review: development of the maskless localized electrochemical deposition technology" The International Journal of Advanced Manufacturing Technology, vol. 110, 2020, pp. 1731-1757.

* cited by examiner

LOCALIZED ELECTROCHEMICAL DEPOSITION

RELATED APPLICATIONS

This application claims the benefit of provisional patent application Ser. No. 63/039,244, filed Jun. 15, 2020, the disclosure of which is hereby incorporated herein by reference in its entirety.

FIELD OF THE DISCLOSURE

The present disclosure relates to electrochemical deposition, such as for patterned electroplating of materials.

BACKGROUND

Many traditional approaches to deposition of metal materials, such as electroplating or sputtering, have the disadvantage of being non-selective additive manufacturing processes, which lead to additional costs associated with additional processing steps. For example, many approaches require masks to define the region where metal is to be deposited.

Alternative metallization techniques and materials have been searched for in the field of solar cells that would reduce the cost and increase the efficiency of solar cells. Currently, a silver paste is deposited on the front of solar cells via a screen-printing process. To make the silver screen printable, organic additives and other materials are mixed in with the silver to create a viscous silver paste. The addition of these additives detracts from desirable properties of silver, such as high conductivity, and increases the resistivity of the paste.

Other methods of patterned metal deposition have been investigated, including the process of chemical electroplating. Chemical electroplating has the advantage of little or no additives in the materials deposited, such that the benefits of a pure metal are not lost when making the material depositable. In the chemical electroplating process, a metal is deposited in a near pure form onto the solar cell, which results in a cheaper and lower resistivity front contact than one created from silver paste.

Figure 1:
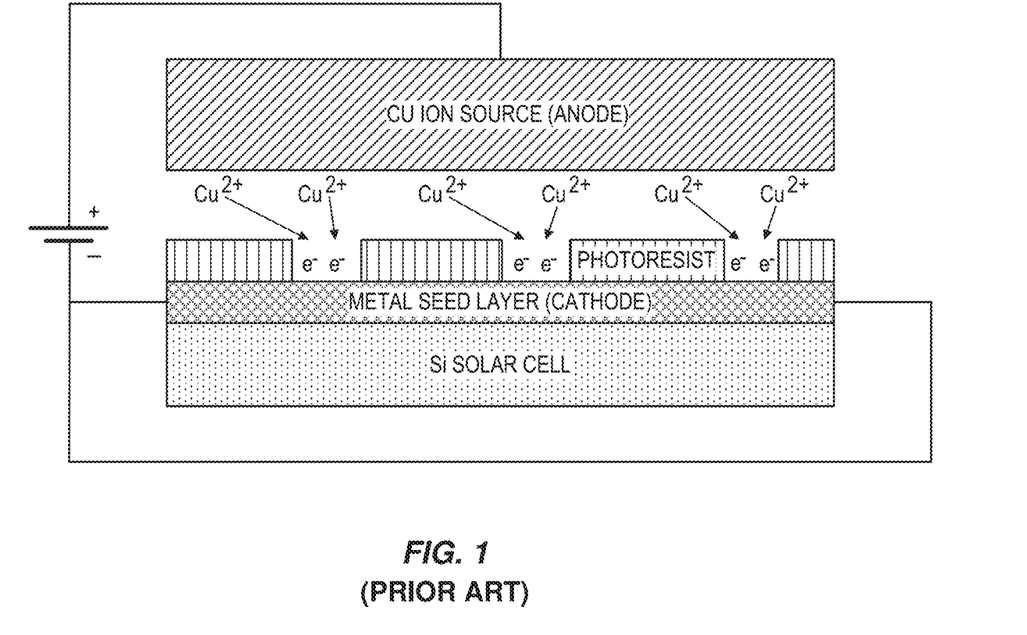
FIG. 1 is a cross-sectional block diagram of a traditional approach to electroplating with a mask layer.

FIG. 1 is a cross-sectional block diagram of a traditional approach to electroplating with a mask layer. Electroplating is generally not a selective process, so it has been necessary to add a mask layer on the surface of the solar cell to define the region to be plated. Depending on the resolution of the masking layer and the material used, this mask can be expensive and difficult to reproduce. The most commonly used masking process in research is photolithography due to its excellent resolution and high aspect ratios. However, the addition of photolithography substantially increases the price of the solar cells and makes some solar cell types unviable for production. Therefore, it is desirable to provide an alternative deposition process which circumvents the need for photolithography and reduces the cost of solar cell production lines.

SUMMARY

Localized electrochemical deposition (LECD) is provided. The aim of LECD is to create a patterned electrodeposited metal layer on a cathode without the use of pre-deposition patterning steps. In embodiments described herein, an LECD device includes a cathode (a material to be plated) placed sufficiently close to a formation anode in a metal electrolyte chemical bath. The LECD device is then activated electrically in solution. An electric field created by the formation anode determines the locations of metal deposition, providing a localized deposition without need for photolithography or other masking of the material to be plated.

An exemplary embodiment provides a LECD device. The LECD device includes a chemical bath; a cathode comprising a deposition surface in contact with the chemical bath; and one or more fixed anodes configured to cause a patterned electrochemical deposition on the deposition surface without masking the deposition surface.

Another exemplary embodiment provides a method for LECD. The method includes providing a deposition anode having a surface pattern in a chemical bath; providing a cathode having a deposition surface to be electrochemically plated; placing the cathode within the chemical bath near the surface pattern of the deposition anode; and energizing the deposition anode and the cathode such that the deposition anode causes localized electrochemical plating on the deposition surface according to the surface pattern of the deposition anode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Localized electrochemical deposition (LECD) is provided. The aim of LECD is to create a patterned electrodeposited metal layer on a cathode without the use of pre-deposition patterning steps. In embodiments described herein, an LECD device includes a cathode (a material to be plated) placed sufficiently close to a formation anode in a metal electrolyte chemical bath. The LECD device is then activated electrically in solution. An electric field created by the formation anode determines the locations of metal deposition, providing a localized deposition without need for photolithography or other masking of the material to be plated.

In an exemplary aspect, the LECD includes one or more fixed anodes in a chemical bath. The fixed anodes cause a patterned electrochemical deposition on a cathode which is brought in contact with the chemical bath and near the fixed anodes. The fixed anodes can be formed using one or more wires or an anode with a patterned surface, as discussed in greater detail below.

In some embodiments, the LECD device also includes an electrolyte source, such as a source anode formed from a material that matches a metal in the electrolyte chemical bath. The source anode is placed away from the formation anode such that the electric field of the source anode replenishes metal in the electrolyte without substantially interfering with the electric field created by the formation anode.

I. Generalized Approach to Localized Electrochemical Deposition (LECD)

Figure 2A:
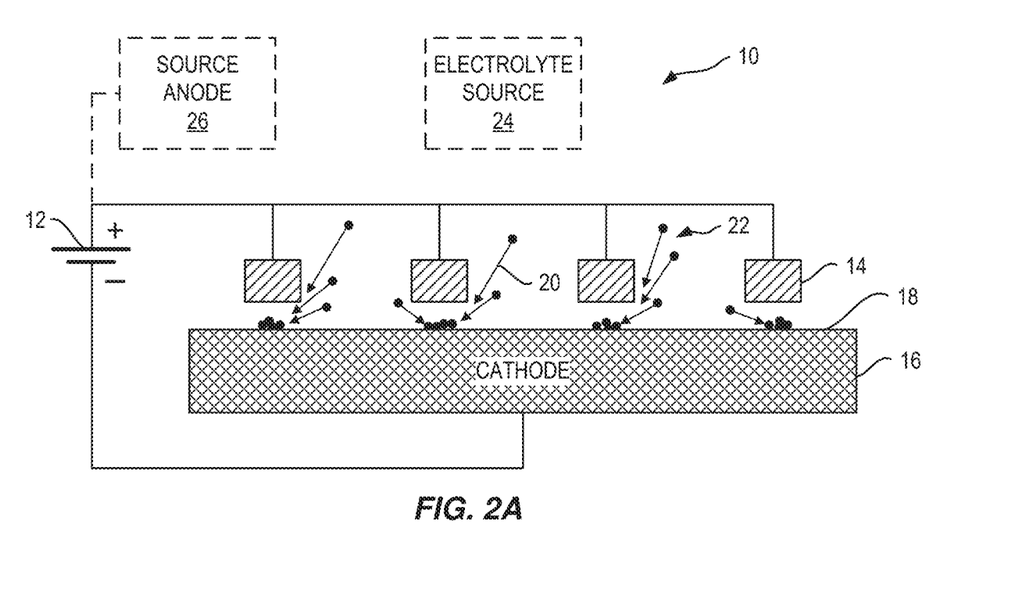
FIG. 2A is a cross-sectional block diagram of a generalized localized electrochemical deposition (LECD) system according to embodiments described herein.

FIG. 2A is a cross-sectional block diagram of a generalized LECD system 10 according to embodiments described herein. The LECD system 10 includes an electrical source 12 connected to one or more deposition anodes 14 and a cathode 16 which includes a deposition surface 18 in a metal electrolyte bath. The cathode 16 can be any conductive material with the deposition surface 18 to be selectively plated. In some embodiments, the cathode 16 includes or is coupled to a substrate (such as a solar cell substrate), though this is not needed. The one or more deposition anodes 14 are made of a material that may or may not dissolve in solution.

As described in further detail below, the one or more deposition anodes 14 cause a patterned electrochemical deposition on the deposition surface 18. The pattern can be any geometric pattern, including a non-regular pattern, and includes one or more lines, curves, circles, rectangles, grids, and so on. The deposition anodes 14 may be at least partially fixed (e.g., restricted in motion laterally and/or vertically relative to the deposition surface 18) and can be formed with wires or a patterned surface to cause the patterned electrochemical deposition on the deposition surface 18.

The one or more deposition anodes 14 and the cathode 16 are placed sufficiently close together (e.g., between 5 and 300 microns (μm), or preferably between 20 and 150 μm) so that the electric field magnitudes between the deposition anode(s) 14 and the cathode 16 are sufficiently large such that the deposition anode(s) 14 dictate electrolyte bath ion flow 20 such that bath ions 22 are deposited in a pattern. This process will continue for the duration of the plating event.

In some embodiments, the LECD system 10 further includes an electrolyte source 24 (e.g., an electrolyte injection system) and/or a source anode 26 to provide or replenish the bath ions 22. For example, the source anode 26 is placed in the electrolyte bath and is made of a metal that dissolves in solution during the plating process. In such embodiments, the electric field magnitudes between the deposition anode(s) 14 and the cathode 16 are larger than the electric field magnitude between the source anode 26 and the cathode 16 such that the source anode 26 primarily replenishes the bath ions 22. In some examples, such as described below in Section II, the one or more deposition anodes 14 also serve as the source anode 26.

In some embodiments, the electrical source 12 is a controlled electrical source 12 which provides a deposition signal to alter the magnitude and bias (e.g., forward or reverse) of the potential between a deposition anode 14 and the cathode 16, including by separately controlling the deposition signal at different deposition anodes 14. For example, after a forward bias (to electroplate the cathode 16), the electrical source 12 may be reverse biased (e.g., with a short pulse) to partially etch the plating. This reverse pulse can clean up any residual (e.g., unintentional) plating (e.g., plating away from the deposition anodes 14) and/or smooth the deposited metal. In some examples, the electrical source 12 can apply a cyclical forward bias and pulsed reverse bias deposition signal to control the thickness of the electrochemical plating.

Figure 2B:
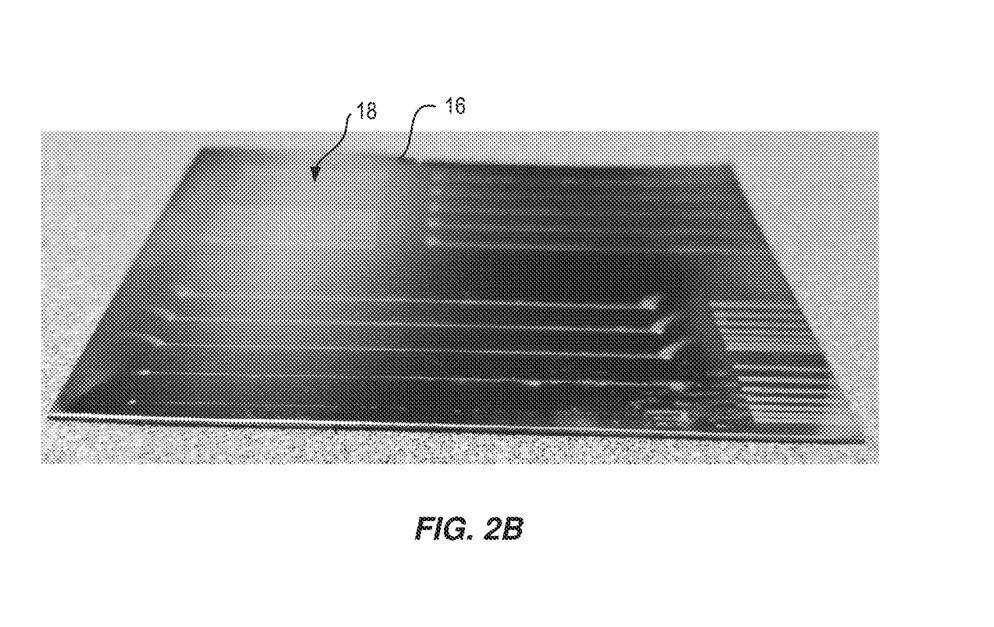
FIG. 2B is a picture of an example cathode where the deposition surface has patterned metal plating formed according to an embodiment of the LECD system of FIG. 2A.

FIG. 2B is a picture of an example cathode 16 where the deposition surface 18 has patterned metal plating formed according to an embodiment of the LECD system 10 of FIG. 2A. Thus, the geometric shape of the deposition anode 14 will imprint to some degree on the cathode 18 in the form of plated metal.

II. LECD System with Masked Deposition Anode

A. Using the Deposition Anode as Source

Figure 3A:
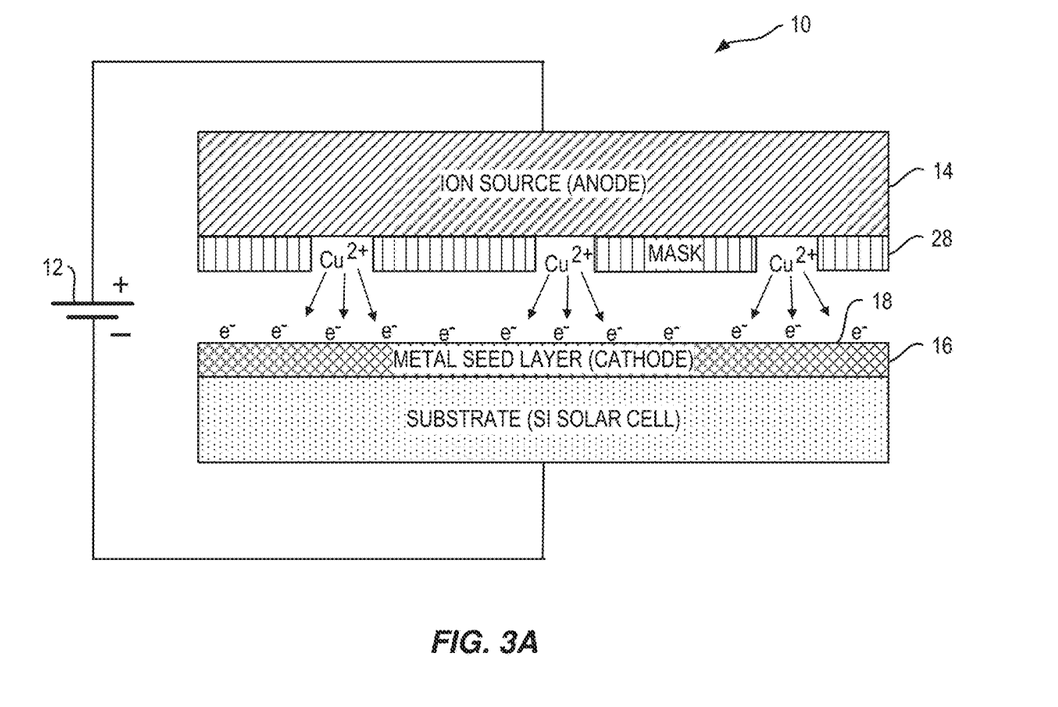
FIG. 3A is a cross-sectional block diagram of an embodiment of the LECD system of FIG. 2A having a deposition anode as an ion source.

FIG. 3A is a cross-sectional block diagram of an embodiment of the LECD system 10 of FIG. 2A having a deposition anode 14 as an ion source. Rather than masking the substrate (e.g., solar cell) as in FIG. 1, the anode 14 is masked to form a patterned surface. The metal plating of FIG. 2B was formed using the embodiment of the LECD system 10 of FIG. 3A. A mask 28 can be placed with an appropriate process, such as photolithography.

Figure 3B:
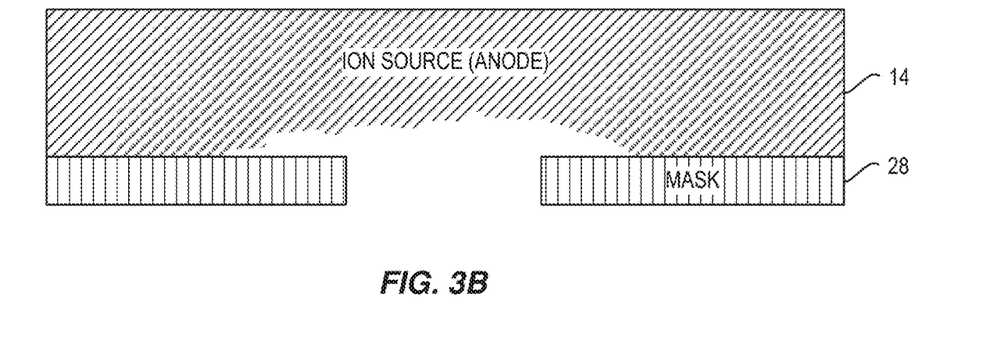
FIG. 3B illustrates depletion of the anode of FIG. 3A.

FIG. 3B illustrates depletion of the deposition anode 14 of FIG. 3A. One issue with the approach of FIG. 3A is that the deposition anode 14 depletes over time. Over time (e.g., after as few as two plating sessions), electrochemical etching of the deposition anode 14 begins to occur under the mask 28. This can lead to plating failure due to uncontrolled plating areas. In addition, the mask pattern may degrade over time in the chemical bath (e.g., by debonding from the metal ion source and being lost in solution).

B. Using an Inert Deposition Anode

Figure 4:
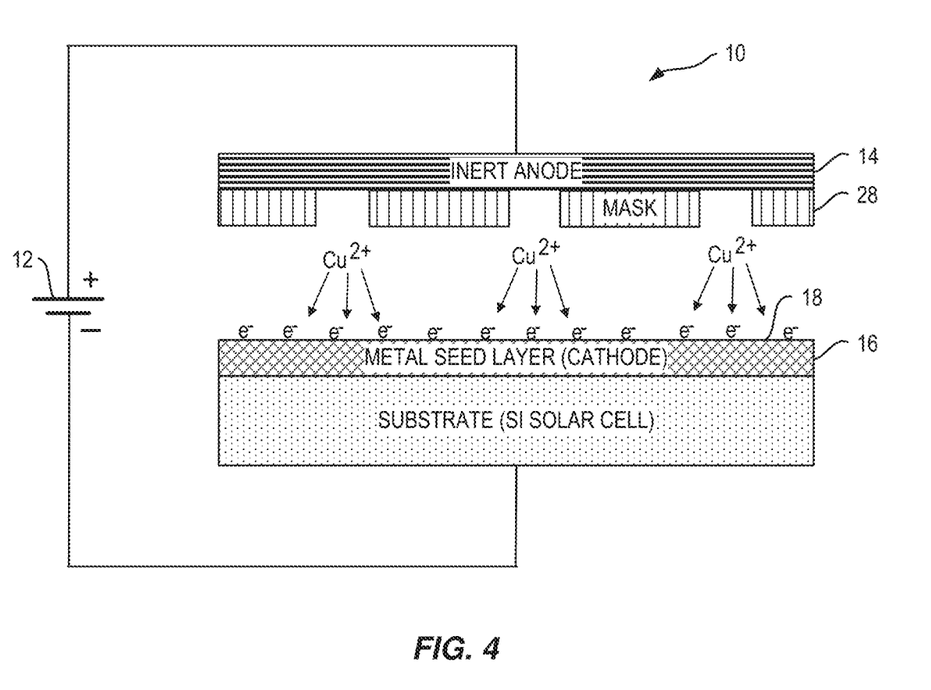
FIG. 4 is a cross-sectional block diagram of another embodiment of the LECD system of FIG. 2A, having an inert deposition anode.
Figure 5A:
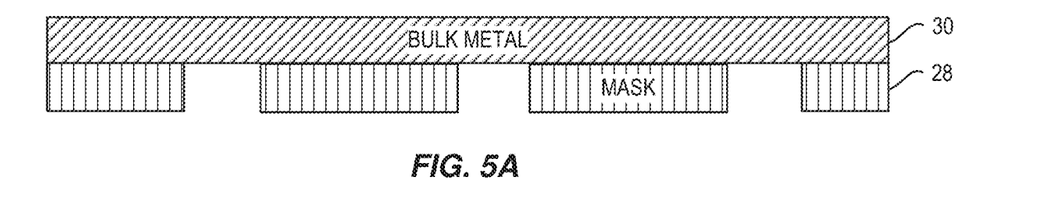
FIGS. 5A-5D illustrate an exemplary process for producing an improved deposition anode over FIGS. 3A and 4.
Figure 5B:
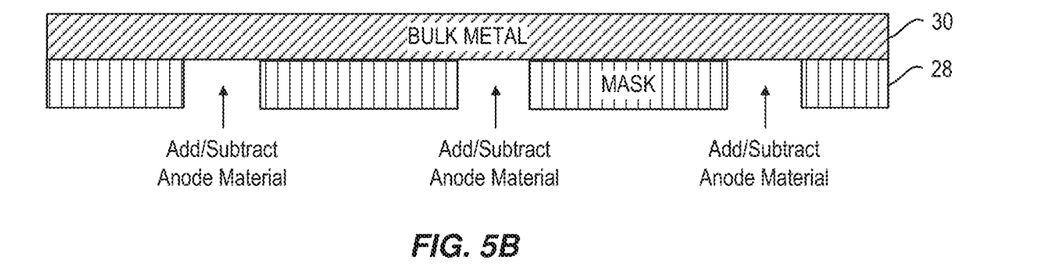
Figure 5C:
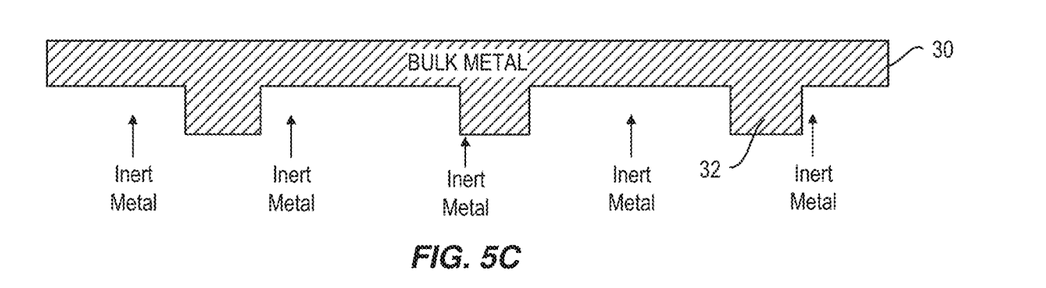
Figure 5D:
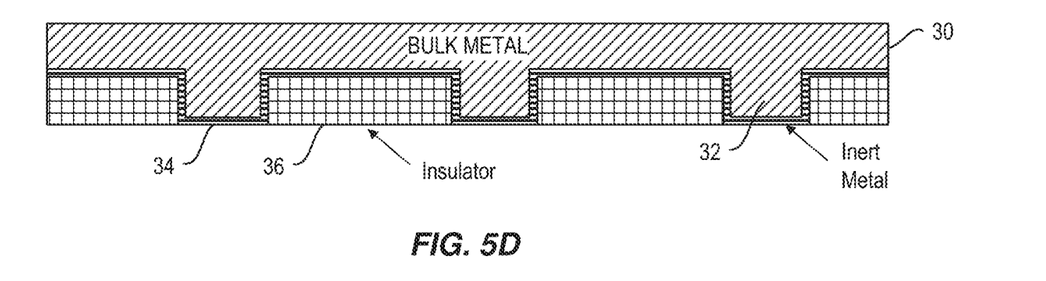

FIG. 4 is a cross-sectional block diagram of another embodiment of the LECD system 10 of FIG. 2A, having an inert deposition anode 14. Here, the deposition anode 14 is formed from a material which is non-reactive (e.g., does not electroplate or etch) in the electrolyte bath. Such a material may have a higher standard electrode potential than a half reaction occurring in the plating bath. Example materials include platinum, gold, silver, or another appropriate material.

As with the embodiment of FIG. 3A, the deposition anode 14 has a surface pattern formed with a mask 28. However, this approach can deplete the electrolyte bath, such that it needs to be replaced or replenished (e.g., using the electrolyte source 24 or the source anode 26 of FIG. 2A such that the source anode 26 can be depleted without affecting plating performance of the deposition anode 14). In addition, issues can occur due to oxygen formation at the inert deposition anode 14. Oxygen becomes trapped between grooves of the mask 28 and plating can cease where there is no solution.

C. Improved Deposition Anode Formation

FIGS. 5A-5D illustrate an exemplary process for producing an improved deposition anode 14 over FIGS. 3A and 4. In this regard, the process includes applying the mask 28 (e.g., a photoresist mask) for conductive fingers on a bulk metal 30 (e.g., a metal plate) at FIG. 5A. The process continues with depositing or removing (e.g., via plating) conductive material, such as by adding material to form conductive fingers 32, at FIG. 5B. The process continues with removing the mask 28. The process continues with depositing (e.g., via plating) an inert metal layer 34 (e.g., with a non-dissolving conductive material, such as platinum) at FIG. 5C. The process continues with filling valleys between the conductive material with an insulating material 36 at FIG. 5D.

Figure 6A:
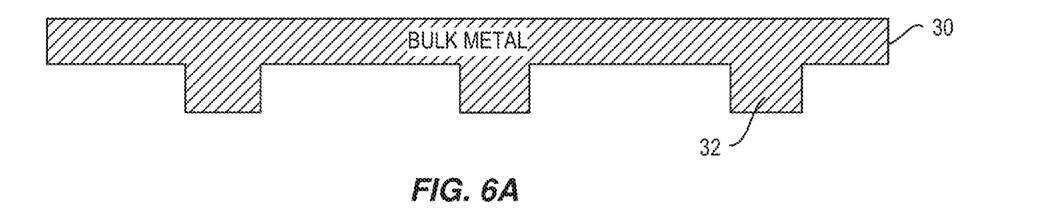
FIGS. 6A-6C illustrate another exemplary process for producing an improved deposition anode over FIGS. 3A and 4.
Figure 6B:
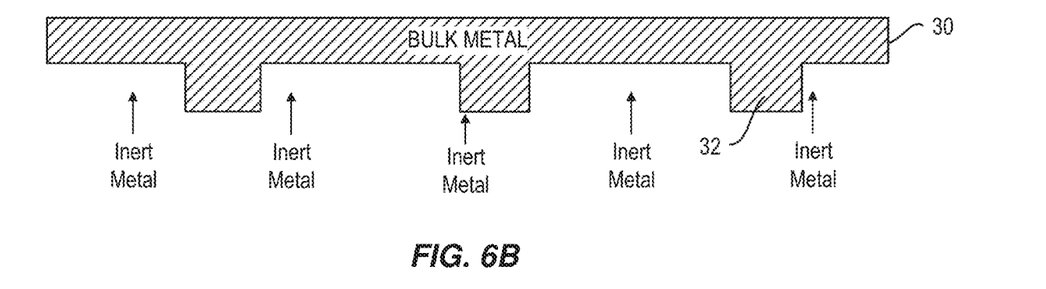
Figure 6C:
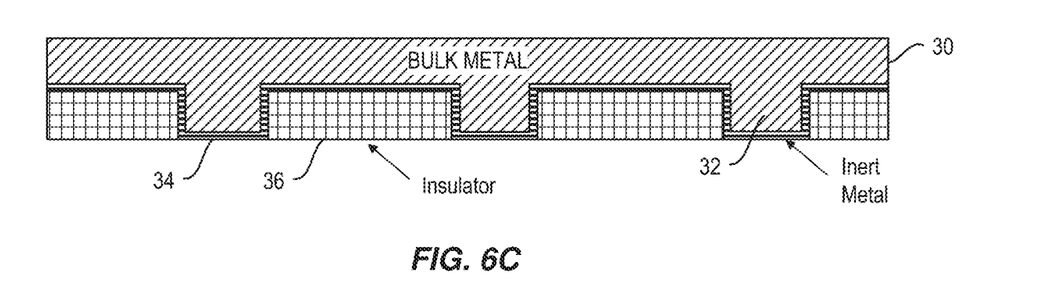

FIGS. 6A-6C illustrate another exemplary process for producing an improved deposition anode 14 over FIGS. 3A and 4. The process includes machining the bulk metal 30 to create the patterned surface (e.g., conductive fingers 32) at FIG. 6A. The process continues with depositing (e.g., via plating) the inert metal layer 34 at FIG. 6B. The process continues with filling valleys between the conductive material with the insulating material 36 at FIG. 6C.

Deposition anodes 14 made with the processes of FIGS. 5A-5D and 6A-6C can improve on the embodiments in FIGS. 3A and 4. Depending on plating orientation and solution flow, oxygen does not become trapped and can be allowed to escape. Inert metal (e.g., the inert metal layer 34) allows for this solution to be used indefinitely i.e., no intermediate steps are required after each plating session. Multiple cathodes 16 can be plated one after the other.

D. Alternative Deposition Anode Formation

FIGS. 7A-7D illustrate a process for producing an alternative deposition anode 14. The process includes depositing (e.g., via plating) an inert metal layer 34 onto a bulk metal 30 (e.g., a metal plate) at FIG. 7A. Both the inert metal layer 34 and the bulk metal 30 are conductive. Generally, the inert metal layer 34 for copper plating is silver, platinum, titanium, or gold (though other materials may be used). These are costly to source and machine, so they can be deposited as a thin layer on top of a cheaper to source and/or machine bulk metal 30.

Figure 7A:
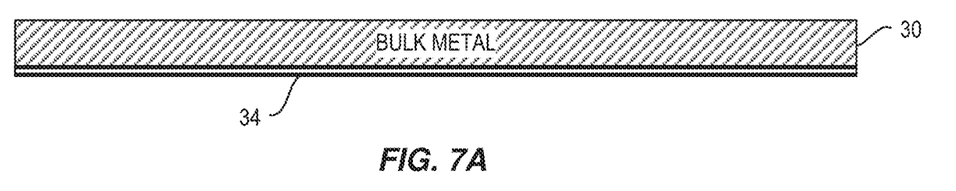
FIGS. 7A-7D illustrate a process for producing an alternative deposition anode.
Figure 7B:
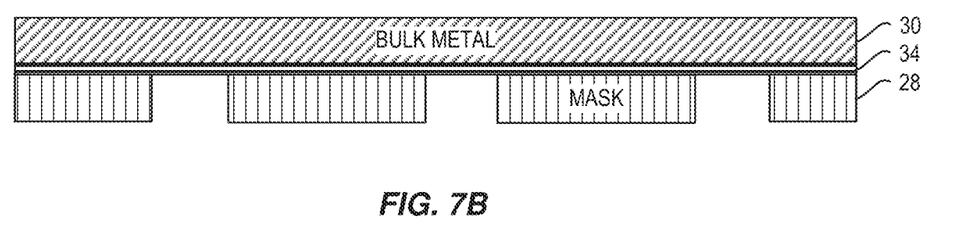
Figure 7C:
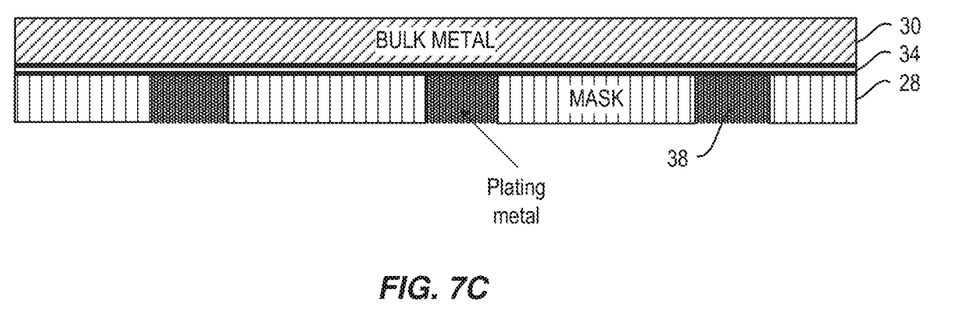
Figure 7D:
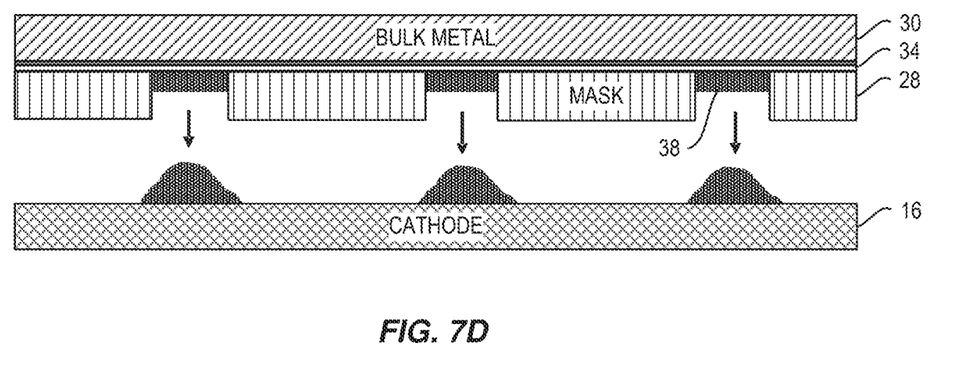

A mask 28 is applied with a desired surface pattern at FIG. 7B. The process continues with electrochemically depositing a metal for deposition 38 (e.g., in the valleys between the pattern of the mask 28) at FIG. 7C. During plating, the cathode 16 is brought near but spaced from the deposition anode 14, and the previously electrochemically deposited metal for deposition 38 is etched as the pattern is formed on the cathode 16. The inert metal layer 34 functions as an electrochemical stopping point, such that the amount of plating can be controlled to a greater degree. In LECD systems 10 using this deposition anode 14, an intermediate anode-plating step is added between cathode-plating operations.

III. LECD Device Implementation

Figure 8:
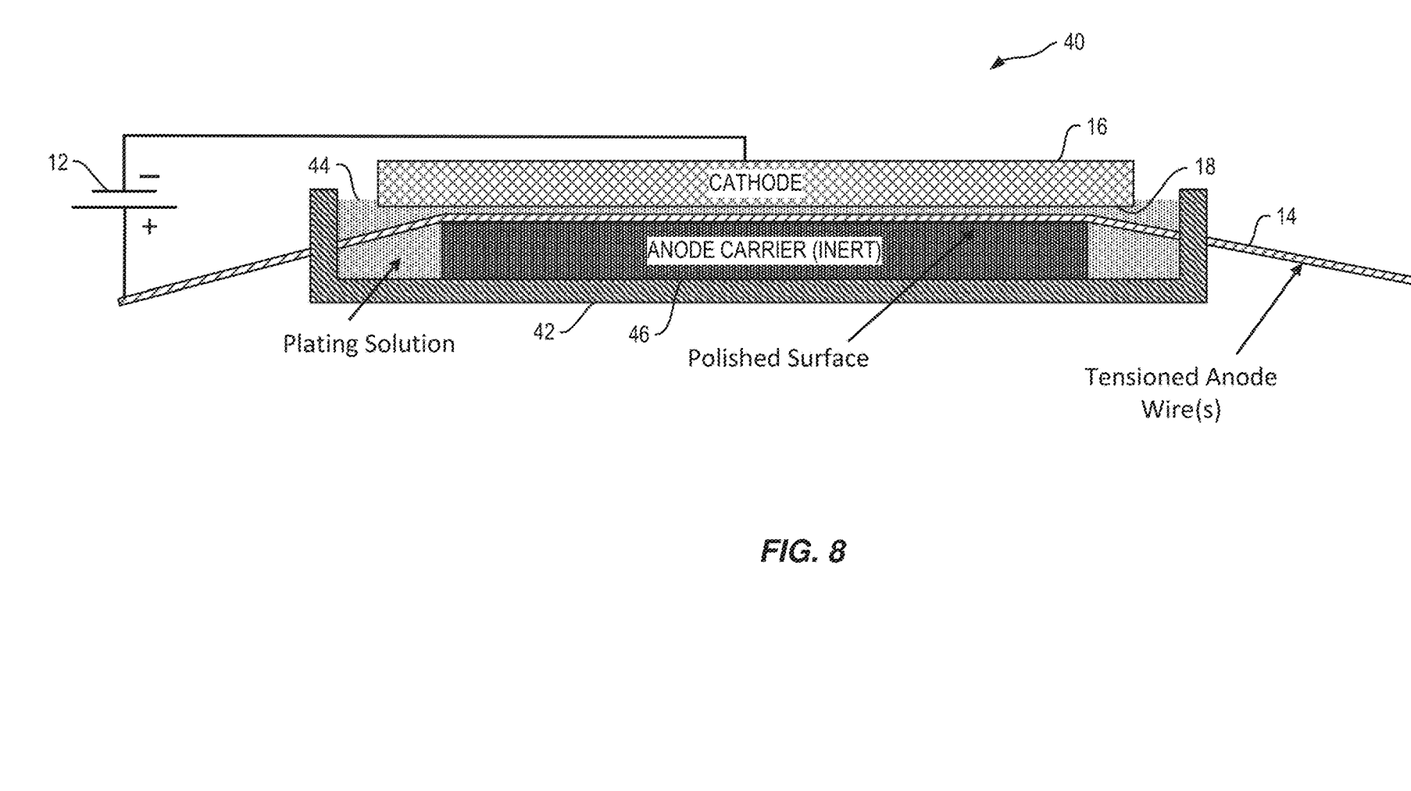
FIG. 8 is a cross-sectional diagram of an embodiment of an LECD device with one or more wire deposition anodes according to the LECD system of FIG. 2A.

FIG. 8 is a cross-sectional diagram of an embodiment of an LECD device 40 with one or more wire deposition anodes 14 according to the LECD system 10 of FIG. 2A. The LECD device 40 includes a chemical bath basin 42, which may be formed from polyvinylidene difluoride (PVDF) or another appropriate non-reactive material. One or more tensioned wires are fixed in place in an electrolyte bath 44 as the deposition anode(s) 14. In some embodiments, these wire deposition anodes 14 are disposed over an anode carrier 46 formed from an inert material with a polished surface. The polished surface is not required, but can assist with uniformity, and a known surface roughness can help with calculating plating parameters.

The deposition surface 18 of the cathode 16 is lowered into the electrolyte bath 44 and brought near the wire deposition anode(s) 14. In some embodiments, inert spacers are placed between the anode carrier 46 and the cathode 16 to maintain a controlled distance between them. In other embodiments, the distance may be controlled in another manner, such as by suspending the cathode 16 in place.

Similar to the embodiments described in Section II, the wire deposition anode(s) 14 can be reactive or non-reactive. With a reactive material, the wire deposition anode 14 can serve as a source to replenish electrolytes (e.g., providing the deposition metal) in solution. This may be readily replaced by feeding a new wire into the LECD device 40 as needed.

With a non-reactive (e.g., inert) material, the wire deposition anode 14 does not need frequent replacement, but the electrolyte solution may become depleted over time. In some embodiments, an inert wire deposition anode 14 can further be coated with a reactive material, such as through electroplating the inert wire deposition anode 14 before electroplating the cathode 16. For example, the LECD device 40 can further include a source anode 26 in the electrolyte bath 44, which can be energized to replenish the inert wire deposition anode 14 (e.g., between cycles of electroplating the cathode 16).

Figure 9:
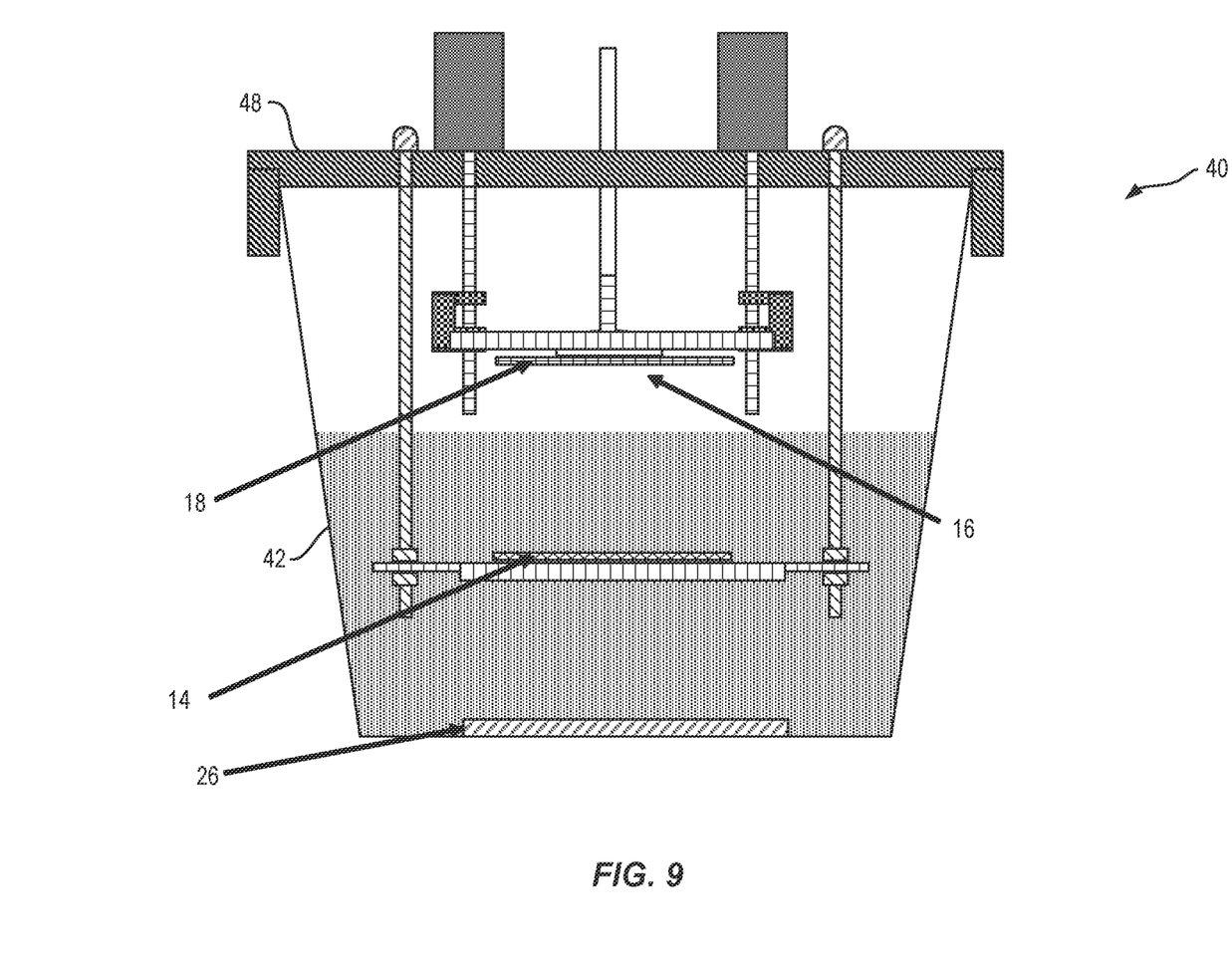
FIG. 9 is a cross-sectional diagram of another embodiment of the LECD device according to the LECD system of FIG. 2A.

FIG. 9 is a cross-sectional diagram of another embodiment of the LECD device 40 according to the LECD system 10 of FIG. 2A. The LECD device 40 also includes a chemical bath basin 42, which may similarly be formed from PVDF or another appropriate non-reactive material. A lid 48 may be formed from acrylonitrile butadiene styrene (ABS) or another appropriate material. In some examples, the hardware illustrated is mounted to the lid 48. Motorized levelers (e.g., using stepper motors) can be used to orient the anode and/or cathode.

As illustrated in FIGS. 8 and 9, in embodiments of the LECD device 40, the one or more deposition anodes 14 are generally at least partially fixed anodes, though they may also have some moveability. For example, the one or more deposition anodes 14 are fixed laterally along a plane parallel to the deposition surface 18 of the cathode 16 (e.g., as illustrated in FIG. 8). In such cases, the cathode 16 (and/or the anodes 14) can also be vertically moveable or fixed. In another example, the one or more deposition anodes 14 are laterally movable (e.g., along a plane parallel to the deposition surface 18 of the cathode 16) while being positioned at a fixed vertical distance from the deposition surface 18.

IV. Process for LECD

Figure 10:
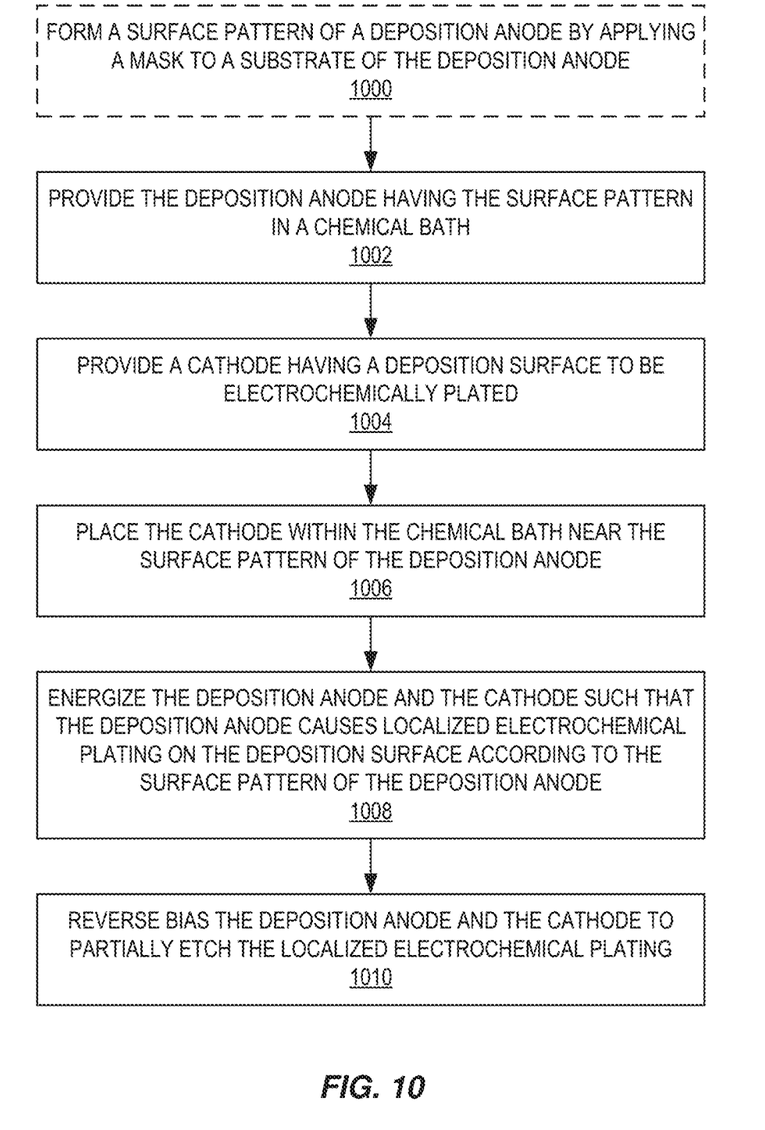
FIG. 10 is a flow diagram illustrating a process for LECD.

FIG. 10 is a flow diagram illustrating a process for LECD. Dashed boxes represent optional steps. The process may optionally begin at operation 1000, with forming a surface pattern of a deposition anode by applying a mask to a substrate of the deposition anode. In an exemplary aspect, this is done similar to the processes of FIGS. 5A-5D or FIG. 6. Alternatively, the deposition anode may be a wire deposition anode. The process continues at operation 1002, with providing the deposition anode having the surface pattern in a chemical bath. The process continues at operation 1004, with providing a cathode having a deposition surface to be electrochemically plated. The process continues at operation 1006, with placing the cathode within the chemical bath near the surface pattern of the deposition anode.

The process continues at operation 1008, with energizing the deposition anode and the cathode such that the deposition anode causes localized electrochemical plating on the deposition surface according to the surface pattern of the deposition anode. The process optionally continues at operation 1010, with reverse biasing the deposition anode and the cathode to partially etch the localized electrochemical plating. In some examples, energizing the deposition anode and the cathode comprises applying a cyclical forward and pulsed reverse bias signal to control a thickness of the localized electrochemical plating.

Although the operations of FIG. 10 are illustrated in a series, this is for illustrative purposes and the operations are not necessarily order dependent. Some operations may be performed in a different order than that presented. Further, processes within the scope of this disclosure may include fewer or more steps than those illustrated in FIG. 10.

Those skilled in the art will recognize improvements and modifications to the preferred embodiments of the present disclosure. All such improvements and modifications are considered within the scope of the concepts disclosed herein and the claims that follow.

What is claimed is:

1. A localized electrochemical deposition (LECD) device, comprising:
    a chemical bath;
    a cathode comprising a deposition surface in contact with the chemical bath;
    a deposition anode configured to cause a patterned electrochemical deposition on the deposition surface without masking the deposition surface, wherein the deposition anode comprises:
        a bulk metal, wherein the bulk metal is formed from a first material that is reactive to the chemical bath; and
        an inert metal layer formed over the bulk metal, wherein the inert metal layer is formed from a second material which is non-reactive to the chemical bath;
    a mask on the inert metal layer such that the mask covers the inert metal layer and such that the inert metal layer is vertically between the mask and the bulk metal, wherein the deposition anode and the mask are separate and displaced from the cathode;
    a source material that is reactive to the chemical bath for electroplating the deposition surface; and
    a voltage source connected to the cathode and the deposition anode.

2. The LECD device of claim 1, wherein the deposition anode is fixed laterally along a plane parallel to the deposition surface.

3. The LECD device of claim 2, wherein at least one of the cathode or the deposition anode is vertically movable.

4. The LECD device of claim 1, wherein the deposition anode is positioned at a fixed vertical distance from the deposition surface.

5. The LECD device of claim 4, wherein at least one of the cathode or the deposition anode is laterally movable along a plane parallel to the deposition surface.

6. The LECD device of claim 1, further comprising a source anode comprising the source material for the LECD device.

7. The LECD device of claim 1, wherein the deposition anode is further coated with the source material for electrochemically plating the cathode.

8. The LECD device of claim 1, wherein the source material is provided as one or more tensioned wires disposed in the chemical bath.

9. The LECD device of claim 1, wherein the deposition anode comprises a patterned electrode.

10. The LECD device of claim 9, wherein the patterned electrode comprises an insulating material deposited between conductive fingers.

11. The LECD device of claim 1, wherein a plating metal in spaces of the mask provides the source material.

12. The LECD device of claim 1, wherein a source anode or an electrolyte source provides the source material.

* * * * *